United States Patent
Drew et al.

(10) Patent No.: US 11,917,798 B2
(45) Date of Patent: Feb. 27, 2024

(54) CHARGING DEVICE MODULE FOR INSTALLATION IN AN ELECTRICALLY DRIVEABLE VEHICLE, VEHICLE AND METHOD FOR COOLING COMPONENTS OF AN ELECTRICALLY DRIVEABLE VEHICLE

(71) Applicant: Vitesco Technologies GmbH, Hannover (DE)

(72) Inventors: Gregory Drew, Munich (DE); Detlev Bagung, Munich (DE); Jürgen Bock, Munich (DE)

(73) Assignee: Vitesco Technologies GmbH (DE)

( * ) Notice: Subject to any disclaimer, the term of this patent is extended or adjusted under 35 U.S.C. 154(b) by 532 days.

(21) Appl. No.: 17/270,542

(22) PCT Filed: Aug. 13, 2019

(86) PCT No.: PCT/EP2019/071759
§ 371 (c)(1),
(2) Date: Feb. 23, 2021

(87) PCT Pub. No.: WO2020/038784
PCT Pub. Date: Feb. 27, 2020

(65) Prior Publication Data
US 2021/0289671 A1    Sep. 16, 2021

(30) Foreign Application Priority Data
Aug. 24, 2018    (DE) .................... 10 2018 214 315.3

(51) Int. Cl.
*H05K 7/20*    (2006.01)
*B60L 53/302*    (2019.01)
*B60K 1/00*    (2006.01)

(52) U.S. Cl.
CPC ........ *H05K 7/20927* (2013.01); *B60L 53/302* (2019.02); *H05K 7/20* (2013.01);
(Continued)

(58) Field of Classification Search
CPC .. H05K 7/20927; H05K 7/20872; H05K 7/20; H05K 7/208; B60L 53/302; B60L 2001/005
(Continued)

(56) References Cited

U.S. PATENT DOCUMENTS

| 5,787,845 A | 8/1998 | Hutchins |
| 6,997,143 B2 | 2/2006 | Piccirilli et al. |

(Continued)

FOREIGN PATENT DOCUMENTS

| CN | 103826895 A | 5/2014 | |
| CN | 103826895 A * | 5/2014 | ............. B60K 11/02 |

(Continued)

OTHER PUBLICATIONS

Amini, Mohammad Reza, et al. "Cabin and battery thermal management of connected and automated HEVs for improved energy efficiency using hierarchical model predictive control." IEEE Trans. on Control Sys. Technology 28.5 1711-1726 (Year: 2019).*
(Continued)

*Primary Examiner* — Cuong H Nguyen
(74) *Attorney, Agent, or Firm* — Buchanan Ingersoll & Rooney PC

(57) ABSTRACT

A charging device module for installation in an electrically driveable vehicle, including a charging device and an internal cooling circuit for cooling the charging device, wherein the internal cooling circuit has connections for connection to a superordinate cooling circuit of the vehicle, wherein the connections comprise at least one inlet and at least one outlet, and a bypass line connects the at least one inlet to the (Continued)

at least one outlet while bypassing the internal cooling circuit, wherein an actuable valve is associated with the at least one inlet, by which valve the flow of coolant through the internal cooling circuit and the bypass line can be controlled.

10 Claims, 3 Drawing Sheets

(52) U.S. Cl.
CPC .... *H05K 7/20872* (2013.01); *B60K 2001/005* (2013.01); *H05K 7/208* (2013.01)

(58) Field of Classification Search
USPC ............................. 60/287; 123/41.31, 41.08
See application file for complete search history.

(56) References Cited

U.S. PATENT DOCUMENTS

| | | | |
|---|---|---|---|
| 7,349,213 | B2 | 3/2008 | Campbell et al. |
| 7,978,470 | B2 | 7/2011 | Uchida et al. |
| 8,689,741 | B2 | 4/2014 | Park et al. |
| 9,295,181 | B2 | 3/2016 | Campbell et al. |
| 9,362,040 | B2 | 6/2016 | Rai et al. |
| 9,468,132 | B2 | 10/2016 | Taguchi et al. |
| 10,113,473 | B2 | 10/2018 | Cherouat et al. |
| 2013/0076126 | A1* | 3/2013 | Hashimoto ............. B60L 50/61 307/9.1 |
| 2015/0146377 | A1* | 5/2015 | You ...................... H01F 27/085 336/55 |
| 2015/0189790 | A1 | 7/2015 | Tachibana |
| 2015/0334874 | A1* | 11/2015 | Rai ......................... H01F 27/08 361/699 |
| 2017/0182896 | A1* | 6/2017 | Masip ................. H05K 7/14322 |
| 2018/0241313 | A1* | 8/2018 | Goto ................. H02M 3/33592 |
| 2018/0321000 | A1* | 11/2018 | Ogaki ................ H05K 7/20945 |

FOREIGN PATENT DOCUMENTS

| | | | | |
|---|---|---|---|---|
| DE | 102005015718 | A1 | 10/2006 | |
| DE | 102005056717 | A1 | 5/2007 | |
| DE | 102011090147 | A1 | 7/2013 | |
| DE | 102015208968 | A1 * | 11/2015 | ............. H01F 27/08 |
| DE | 102015208968 | A1 | 11/2015 | |
| DE | 102016218020 | A1 | 4/2018 | |
| DE | 102016218020 | A1 * | 4/2018 | ............. H05K 7/208 |
| DE | 112016003577 | T5 | 5/2018 | |
| DE | 112016005535 | T5 | 8/2018 | |
| DE | 112016005535 | T5 * | 8/2018 | ............. B60K 11/04 |
| EP | 2876984 | A2 | 5/2015 | |
| EP | 2876984 | A2 * | 5/2015 | ........... H01F 27/085 |
| EP | 3185406 | A1 * | 6/2017 | ............. B60L 53/20 |
| EP | 3185406 | A1 | 6/2017 | |
| JP | 04329698 | A | 11/1992 | |
| KR | 20090112834 | A | 10/2009 | |
| WO | 2017048172 | A1 | 3/2017 | |
| WO | 2017094444 | A1 | 6/2017 | |
| WO | WO-2017094444 | A1 * | 6/2017 | ............. B60K 11/04 |

OTHER PUBLICATIONS

Babu, Anandh Ramesh, Blago Minovski, and Simone Sebben. "Thermal encapsulation of large battery packs for electric vehicles operating in cold climate." Applied Thermal Engineering 212 118548 (Year: 2022).*
Yan, Chizhou, et al. "Health management for pem fuel cells based on an active fault tolerant control strategy." IEEE Transactions on Sustainable Energy 12.2 1311-1320 (Year: 2020).*
Griefnow, Philip, et al. "Nonlinear model predictive control of mild hybrid powertrains with electric supercharging." IEEE Transactions on Vehicular Technology 70.9 : 8490-8504 (Year: 2021).*
J. Lopez-Sanz et al., "Thermal Management in Plug-In Hybrid Electric Vehicles: A Real-Time Nonlinear Model Predictive Control Implementation," in IEEE Transactions on Vehicular Technology, vol. 66, No. 9, pp. 7751-7760, Sep. 2017, doi: 10.1109/TVT.2017. 2678921. (Year: 2017).*
J. Lopez-Sanz et al., "Nonlinear Model Predictive Control for Thermal Management in Plug-in Hybrid Electric Vehicles," in IEEE Transactions on Vehicular Technology, vol. 66, No. 5, pp. 3632-3644, May 2017, doi: 10.1109/TVT.2016.2597242. (Year: 2017).*
Robust Predictive Battery Thermal Management Strategy for Connected and Automated Hybrid Electric Vehicles Based on Thermoelectric Parameter Uncertainty by Chong Zhu; Fei Lu; IEEE Journal of Emerging and Selected Topics in Power Electronics Year: 2018 | vol. 6, Issue: 4 (Year: 2018).*
Li, Jiling, and Zhen Zhu. "Battery thermal management systems of electric vehicles." (2014). (Year: 2014).*
International Search Report and Written Opinion for International Application No. PCT/EP2019/071759, dated Nov. 14, 2019, with partial English translation, 9 pages.
International Search Report and Written Opinion for International Application No. PCT/EP2019/071759, dated Nov. 14, 2019, 15 pages (German).
German Examination Report for German Application No. 10 2018 214 315.3, dated Apr. 23, 2019, 7 pages.
Chinese Office Action with Search Report for Chinese Application No. 201980055722.8, with partial translation, dated Feb. 25, 2023, 8 pages.

* cited by examiner

Charging Device Module For Installation In An Electrically Driveable Vehicle, Vehicle And Method For Cooling Components Of An Electrically Driveable Vehicle

CROSS REFERENCE TO RELATED APPLICATIONS

This application is the U.S. National Phase Application of PCT International Application No. PCT/EP2019/071759, filed Aug. 13, 2019, which claims priority to German Patent Application No. 10 2018 214 315.3, filed Aug. 24, 2018, the contents of such applications being incorporated by reference herein.

FIELD OF THE INVENTION

The invention relates to a charging device module for installation in an electrically driveable vehicle. It further relates to an electrically driveable vehicle and to a method for cooling components of an electrically driveable vehicle.

BACKGROUND OF THE INVENTION

In order to charge energy stores of electrically driveable vehicles, a charging device is required which is installed either in the charging infrastructure, for example a charging post, or in the vehicle itself. The latter embodiment has the advantage that the energy stores of the vehicle can be charged at a conventional power socket and therefore, for example, in the owner's garage.

DE 10 2011 090 147 A1, incorporated herein by reference, discloses using a branch line of a cooling circuit of a vehicle for cooling the charging device.

US 2015/0189790 A1 and DE 11 2016 003 577 T5, each incorporated herein by reference, disclose charging devices with an internal cooling circuit.

SUMMARY OF THE INVENTION

An aspect of the present invention is a charging device module for installation in an electrically driveable vehicle, which charging device module has a longer service life than conventionally installed charging devices.

A new electrically driveable vehicle and a new method for cooling components of an electrically driveable vehicle are further intended to be specified.

One aspect of the invention specifies a charging device module for installation in an electrically driveable vehicle. The charging device module has a charging device and an internal cooling circuit for cooling the charging device, wherein the internal cooling circuit has connections for connection to a superordinate cooling circuit of the vehicle. The superordinate cooling circuit is, for example, a cooling circuit which is designed to cool an electric drive motor of the vehicle. In an expedient embodiment, the superordinate cooling circuit has a heat exchanger for giving off heat to the area surrounding the vehicle.

The connections comprise at least one inlet and at least one outlet. This is understood to mean, in particular, that the charging device has at least one inlet and at least one outlet as connections for connection to the superordinate cooling circuit.

A bypass line connects the at least one inlet to the at least one outlet while bypassing the internal cooling circuit. An actuable valve is associated with the at least one inlet, by means of which valve the flow of coolant through the internal cooling circuit and the bypass line can be controlled.

A charging device for installation in an electrically driveable vehicle is understood here and below to mean a so-called on-board charger which typically comprises a rectifier and a transformer and controls the charging process of the electrical energy stores.

An electrically driveable vehicle is understood here and below to mean a vehicle which has at least one electrically operated drive motor, for example an electric car or a so-called plug-in hybrid vehicle.

In particular, the charging device is in charging operation—i.e. has an operating current applied to it for charging an electrical energy store of the vehicle—only when the vehicle is stationary with the motor switched off, that is to say is not in driving operation.

The charging device module has the advantage that the valve can be actuated in such a way that coolant from the superordinate cooling circuit of the vehicle flows through the charging device only when the charging device is in charging operation and there is therefore a need for cooling. If the charging device is not in charging operation, it has no need for cooling. The charging device is advantageously connected firstly to the superordinate cooling circuit of the vehicle, but the coolant of this cooling circuit preferably does not flow through it while the vehicle is in driving operation and the charging device is not in charging operation and therefore has no need for cooling.

Using the bypass line can then have the advantage that heated coolant, which carries away heat from other components of the vehicle during driving operation of the vehicle for example, does not flow through the charging device. This greatly reduces changing thermal loads on the charging device and increases its service life.

The bypass line can be guided, in particular, outside a housing of the charging device module. This has the advantage that even minimal transfer of heat to the charging device can be virtually excluded. In addition, this embodiment has the advantage that the valve can be integrated in an inlet port of the housing.

According to one embodiment, the internal cooling circuit is guided inside a cooler which is associated with a housing of the charging device module. In this embodiment, the charging device module has, for example, a cooler which is flange-connected to its housing and is designed, for example, as a plate cooler. The cooler absorbs heat from the charging device and is therefore functionally associated with it. Although the internal cooling circuit is not accommodated in the same housing as the charging device in this embodiment, a cooler of this kind is also referred to as an internal "cooling circuit" here because it constitutes a branch of the superordinate cooling circuit that serves solely to cool the charging device.

The valve can be actuated, in particular, by means of a control unit of the charging device. This has the advantage that the close communication between the charging device and the coolant flow can be used to prevent the charging device from overheating. For example, a particular valve position, which connects the internal cooling circuit to the superordinate cooling circuit of the vehicle, can be made a condition for the charging device to be able to start charging operation.

In addition, this embodiment has the advantage that the charging device can be sold and delivered as a complete module, with no modifications to a control device of the vehicle or its software being required in order to enable valve control.

However, in a refinement that is currently not claimed, the valve can alternatively or additionally be actuated by means of a superordinate control device of the vehicle. This may be advantageous if data which is not available to the control unit of the charging device is intended to be used for actuating the valve.

The valve can be arranged outside or inside a housing of the charging device module. If the valve is arranged outside the housing, the bypass line can also be guided entirely outside the housing, so that transfer of heat from the coolant to the charging device is minimized. If the valve is arranged inside the housing, this may then have the advantage that the outside of the housing is of particularly simple construction and no installation space for the bypass line has to be provided outside the housing.

According to one embodiment, the hydraulic resistance of the bypass line is matched to the hydraulic resistance of the internal cooling circuit of the charging device. For example, the bypass line is shaped and dimensioned in such a way that it has, at least substantially, the same hydraulic resistance as the internal cooling circuit. This has the advantage that the switching position of the valve has no influence on the hydraulic conditions in the superordinate cooling circuit. Therefore, it is not necessary to regulate, for example, a coolant pressure depending on the switching state of the valve.

A further aspect of the invention specifies an electrically driveable vehicle which has electrical energy stores and at least one above-described charging device which is installed in the vehicle.

A further aspect of the invention specifies a method for cooling components of an electrically driveable vehicle by means of a coolant which is guided in a cooling circuit, wherein the cooling circuit is actuated in such a way that, during driving operation of the vehicle, coolant does not flow through a section of the cooling circuit which serves for cooling a charging device of the vehicle.

In this case, the charging device is preferably a charging device according to one of the above-described exemplary embodiments, and the cooling circuit contains the superordinate cooling circuit of the vehicle and the internal cooling circuit for cooling the charging device, wherein the latter constitutes the section for cooling the charging device.

In one embodiment of the method, the control unit of the charging device controls the valve position of the actuable valve in such a way that coolant from the superordinate cooling circuit flows through the internal cooling circuit during charging operation of the charging device and flows through the bypass line during driving operation of the vehicle.

The vehicle and the method for cooling components of the vehicle have the advantages described above in connection with the charging device.

BRIEF DESCRIPTION OF THE DRAWINGS

Further advantages and advantageous refinements and developments of the charging device, the vehicle and the method are evident from the following exemplary embodiments which are described in connection with the figures.

DETAILED DESCRIPTION OF THE PREFERRED EMBODIMENTS

Figure 1:
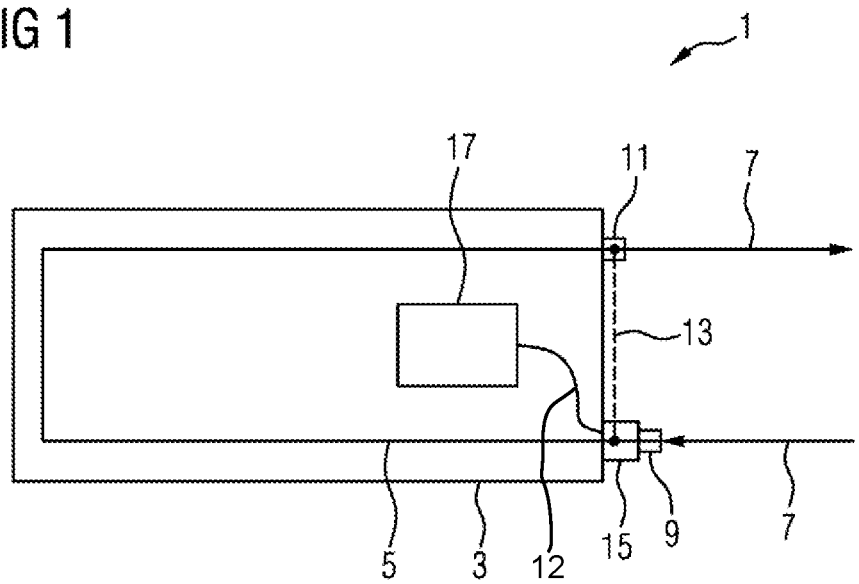
FIG. 1 schematically shows a diagram of a charging device module according to one embodiment of the invention, FIG. 2 schematically shows a perspective view of a detail of the charging device module according to FIG. 1, and FIG. 3 schematically shows a diagram of a vehicle according to a refinement that is currently not claimed.

The charging device module 1 according to FIG. 1 is designed as an on-board charger of an electrically driveable vehicle 21 and therefore can be installed in the vehicle 21.

The charging device module 1 has a housing 3 in which a charging device, together with its essential components, is installed, wherein not all of these components are illustrated in FIG. 1. These essential components typically comprise rectifiers and/or transformers and at least one control unit 17. An internal cooling circuit 5 of the charging device module 1 is further guided through the housing 3.

The internal cooling circuit 5 leads from an inlet 9, through the charging device module, to an outlet 11. The internal cooling circuit 5 is connected to a superordinate cooling circuit 7 of the vehicle at the inlet 9 and the outlet 11 For this purpose, the inlet 9 and the outlet 11 are embodied as corresponding connection ports.

The connection port of the inlet 9 further comprises a valve 15 which is designed, in particular, as an electrically actuable valve. The valve 15 has the task of connecting the superordinate cooling circuit 7 either to the internal cooling circuit 5 or to a bypass line 13 which connects the inlet 9 to the outlet 11 while bypassing the internal cooling circuit 5. If, accordingly, the valve 15 assumes a switching position in which the superordinate cooling circuit 7 is connected to the bypass line 13, coolant does not flow through the internal cooling circuit 5 and said internal cooling circuit is decoupled from the superordinate cooling circuit 7.

In this switching position of the valve 15 which is assumed at least when the vehicle 21 is in driving operation and when the charging device is not in charging operation, no heat is exchanged between the superordinate cooling circuit 7 and the charging device. Accordingly, the charging device cannot be heated by heat which the other components of the vehicle 21 have given off to the superordinate cooling circuit 7.

If the valve 15 is in its other position in which the internal cooling circuit 5 is connected to the superordinate cooling circuit 7, coolant is conducted out of the superordinate cooling circuit 7 through the charging device module 1. This valve position is assumed when the charging device is in charging operation.

The charging device is in charging operation only when the vehicle 21 is not in driving operation. Therefore, coolant from the superordinate cooling circuit 7 of the vehicle 21 flows through the charging device module 1 only when components of the vehicle 21 which require a great degree of cooling, for example a drive motor 23, do not introduce any heat into the coolant and accordingly said coolant is at a low temperature.

In the embodiment according to FIG. 1, the control unit 17 of the charging device is electrically connected to the valve 15 by signal line 12 and is designed to control the valve 15 as described above.

Figure 2:
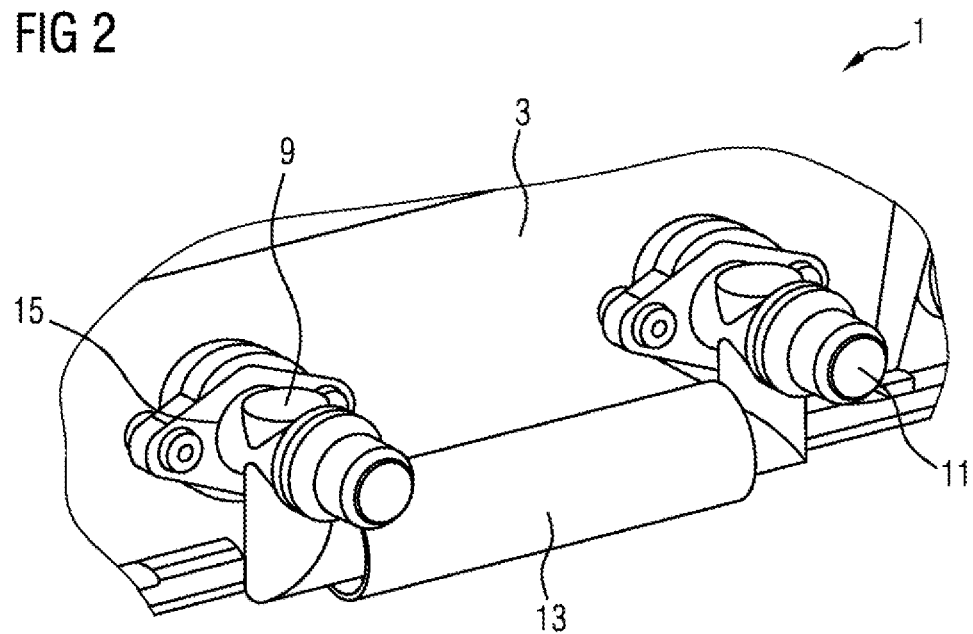

FIG. 2 shows a perspective view of a detail of the charging device module 1 according to FIG. 1. In this embodiment, the bypass line 13 is arranged outside the housing 3 and connects the inlet 9, which also has the valve 15, to the outlet 11.

Figure 3:
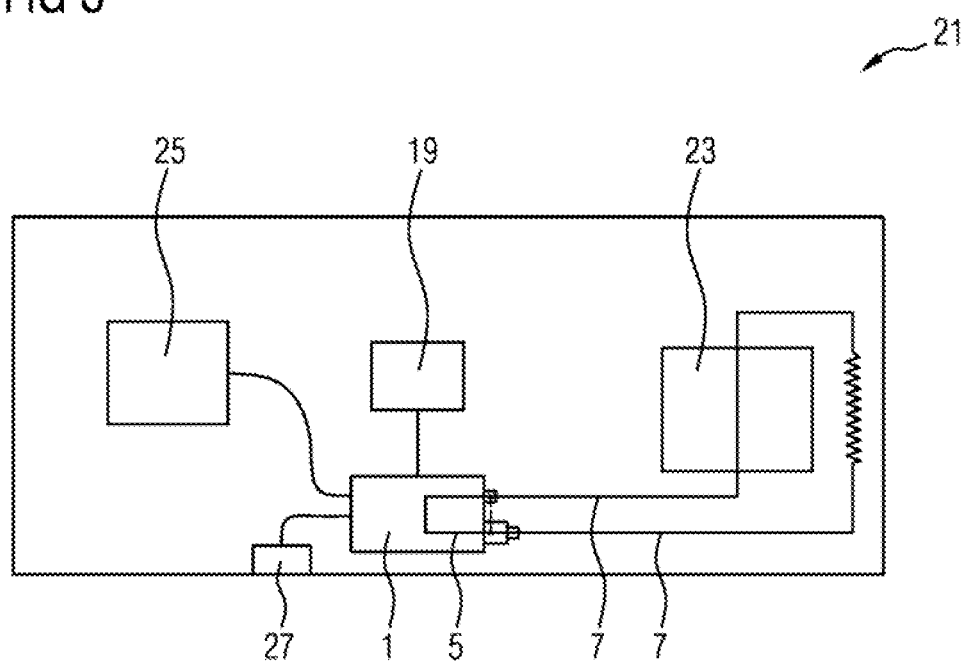
Figure 4:
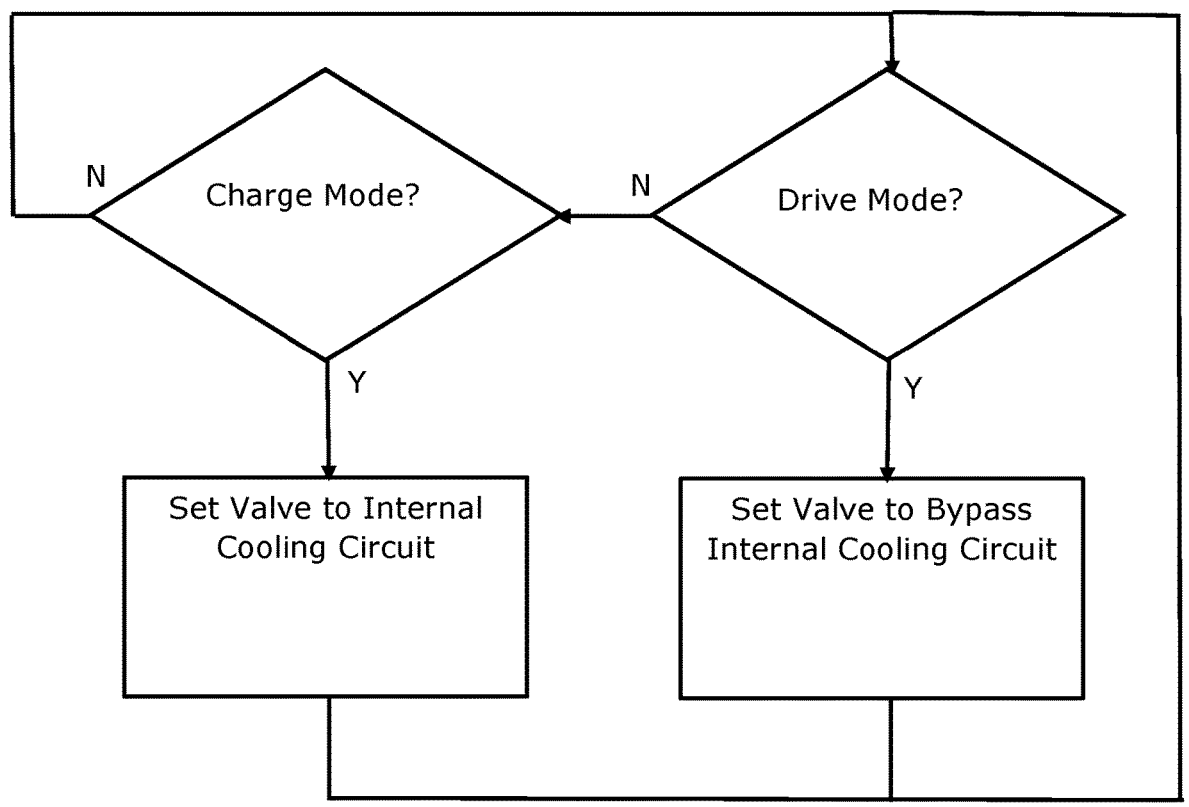
FIG. 4 illustrates a flow chart of a method according to an aspect of the invention.

FIG. 3 shows an electrically driveable vehicle 21 comprising an electric drive motor 23 which is cooled by the superordinate cooling circuit 7, and electrical energy stores 25 which can be charged by an external power source by means of the charging device module 1. The vehicle 21 has an external electrical connection 27 for connecting the charging device to the external power source.

In contrast to the embodiment of FIG. 1, the valve 1 in the embodiment of FIG. 3 is not actuated by the control unit 17 of the charging device. Instead, the vehicle has a superordinate control device 19, i.e. a control device which is provided to control at least one function of the charging device—e.g. the position of the valve 15—and at least one further function of the vehicle outside the charging device. In the present embodiment, the control device 19, in an analogous manner to that described for the control unit 17 of the embodiment according to FIG. 1, switches over the valve position 15 for charging operation of the charging device and driving operation of the vehicle 21.

The invention claimed is:

1. A charging device module for installation in an electrically driveable vehicle, comprising a charging device and an internal cooling circuit for cooling the charging device, wherein the internal cooling circuit has connections for connection to a superordinate cooling circuit of the vehicle, wherein the connections comprise at least one inlet and at least one outlet, and a bypass line connects the at least one inlet to the at least one outlet while bypassing the internal cooling circuit, wherein an actuable valve is associated with the at least one inlet, by which valve the flow of coolant through the internal cooling circuit and the bypass line can be controlled, wherein the valve can be actuated by a control unit of the charging device.

2. The charging device module as claimed in claim 1, wherein the bypass line is guided outside a housing of the charging device module.

3. The charging device module as claimed in claim 1, wherein the valve is arranged outside a housing of the charging device module.

4. The charging device module as claimed in claim 1, wherein the valve is arranged inside a housing of the charging device module.

5. The charging device module as claimed in claim 1, wherein the internal cooling circuit is guided inside a housing of the charging device module.

6. The charging device module as claimed in claim 1, wherein the internal cooling circuit is guided inside a cooler which is associated with a housing of the charging device module.

7. The charging device module as claimed in claim 1, wherein the hydraulic resistance of the bypass line is matched to the hydraulic resistance of the internal cooling circuit of the charging device module.

8. An electrically driveable vehicle which has electrical energy stores and at least one charging device module as claimed in claim 1 which is installed in the vehicle.

9. A method for cooling components of an electrically driveable vehicle by a coolant which is guided in a cooling circuit, wherein the cooling circuit is actuated in such a way that, during driving operation of the vehicle, coolant does not flow through a section of the cooling circuit which serves for cooling a charging device of the vehicle, wherein the vehicle has a charging device module as claimed in claim 1, and wherein the control unit of the charging device controls the valve position of the actuable valve in such a way that coolant from the superordinate cooling circuit flows through the internal cooling circuit during charging operation of the charging device and flows through the bypass line during driving operation of the vehicle.

10. The method as claimed in claim 9, wherein the valve position of the actuable valve, which valve position connects the internal cooling circuit to the superordinate cooling circuit of the vehicle, is made a condition for the charging device to be able to start charging operation.

\* \* \* \* \*